(12) United States Patent
Hsu et al.

(10) Patent No.: US 7,492,234 B2
(45) Date of Patent: Feb. 17, 2009

(54) PRINTED CIRCUIT BOARD

(75) Inventors: Shou-Kuo Hsu, Tu-Cheng (TW); Cheng-Hong Liu, Tu-Cheng (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 143 days.

(21) Appl. No.: 11/309,638

(22) Filed: Sep. 1, 2006

(65) Prior Publication Data

US 2007/0222537 A1 Sep. 27, 2007

(30) Foreign Application Priority Data

Mar. 20, 2006 (CN) .................. 2006 1 0034598

(51) Int. Cl.
*H03H 7/38* (2006.01)
(52) U.S. Cl. .............. 333/33; 333/1; 333/260; 333/263
(58) Field of Classification Search .......... 333/33
See application file for complete search history.

(56) References Cited

U.S. PATENT DOCUMENTS

| | | | | |
|---|---|---|---|---|
| 5,003,273 | A * | 3/1991 | Oppenberg | 333/1 |
| 5,945,886 | A * | 8/1999 | Millar | 333/1 |
| 7,154,356 | B2 * | 12/2006 | Brunette et al. | 333/33 |
| 2005/0199422 | A1 | 9/2005 | Hashim et al. | |
| 2006/0255877 | A1 * | 11/2006 | Jiang et al. | 333/33 |
| 2007/0103251 | A1 * | 5/2007 | Fan et al. | 333/33 |
| 2007/0205847 | A1 * | 9/2007 | Kushta et al. | 333/33 |

* cited by examiner

*Primary Examiner*—Vibol Tan
(74) *Attorney, Agent, or Firm*—Wei Te Chung

(57) ABSTRACT

A printed circuit board (PCB) includes at least one signal layer, a ground layer, at least two signal lines, and at least one grounded line. The signal lines are arranged on the signal layer for transmitting signals. The grounded line is arranged on the signal layer and between the signal lines. A plurality of vias are defined in the grounded line, and the vias are connected to the ground layer. A distance between each two adjacent vias is so arranged that a resonant frequency of an electromagnetic wave transmitted on the grounded line must greater than a highest frequency of the signals transmitted on the signal lines. A related method for designing the PCB is also provided.

9 Claims, 2 Drawing Sheets

PRINTED CIRCUIT BOARD

DESCRIPTION

1. Field of the Invention

The present invention relates to printed circuit boards (PCBs) and methods for designing PCBs, and more particularly to a PCB for reducing crosstalk of signal lines and a method for designing the PCB.

2. Description of Related Art

With the rapid improvement in speed of switches in integrated circuits (ICs), demand for better quality transmission characteristics of signal lines is growing.

Referring to FIG. 1, a signal layer 20 of a conventional printed circuit board (PCB) is shown. Two signal lines 24, 26 are arranged on the signal layer 20, and a grounded line 22 is arranged on the signal layer 20 between the two signal lines 24 and 26 for reducing crosstalk of the two signal lines 24, 26. Suppose the signal line 24 is a driven line and a source of crosstalk disturbance, and the signal line 26 is undriven and therefore a victim line subject to the disturbance. During signal transmission, crosstalk occurs when there is a coupling of energy between the driven line 24 and the victim line 26. A plurality of vias 22 are defined in the grounded line 22 and the vias 222 are connected to a ground layer (not shown) of the PCB. The vias 222 can transfer the noise, which is coupled to the grounded line 22 from the driven line 24, to the ground layer, thereby reducing crosstalk between the two signal lines 24 and 26.

Distance between two adjacent vias 222 is typically arranged arbitrarily, if the distance between two adjacent vias 222 matches a wavelength of the electromagnetic wave of a signal of the driven line 24, noise from the driven line 24 will easily be coupled to the victim line 26 via the grounded line 22, thereby the grounded line 22 does not reduce crosstalk between the two signal lines 24 and 26, but in fact, increases crosstalk disturbance.

What is desired, therefore, is a printed circuit board method for producing same which consistently and effectively reduces crosstalk between signal lines.

SUMMARY OF THE INVENTION

In one preferred embodiment, a printed circuit board (PCB) includes at least one signal layer, a ground layer, at least two signal lines, and at least one grounded line. The signal lines are arranged on the signal layer for transmitting signals. The grounded line is arranged on the signal layer and between the signal lines. A plurality of vias are defined in the grounded line, and the vias are connected to the ground layer. A distance between each two adjacent vias is so arranged that a resonant frequency of an electromagnetic wave transmitted on the grounded line must greater than a highest frequency of the signals transmitted on the signal lines. A related method for designing the PCB is also provided.

Other advantages and novel features will become more apparent from the following detailed description of preferred embodiments when taken in conjunction with the accompanying drawings, in which:

DETAILED DESCRIPTION OF THE INVENTION

Figure 1:
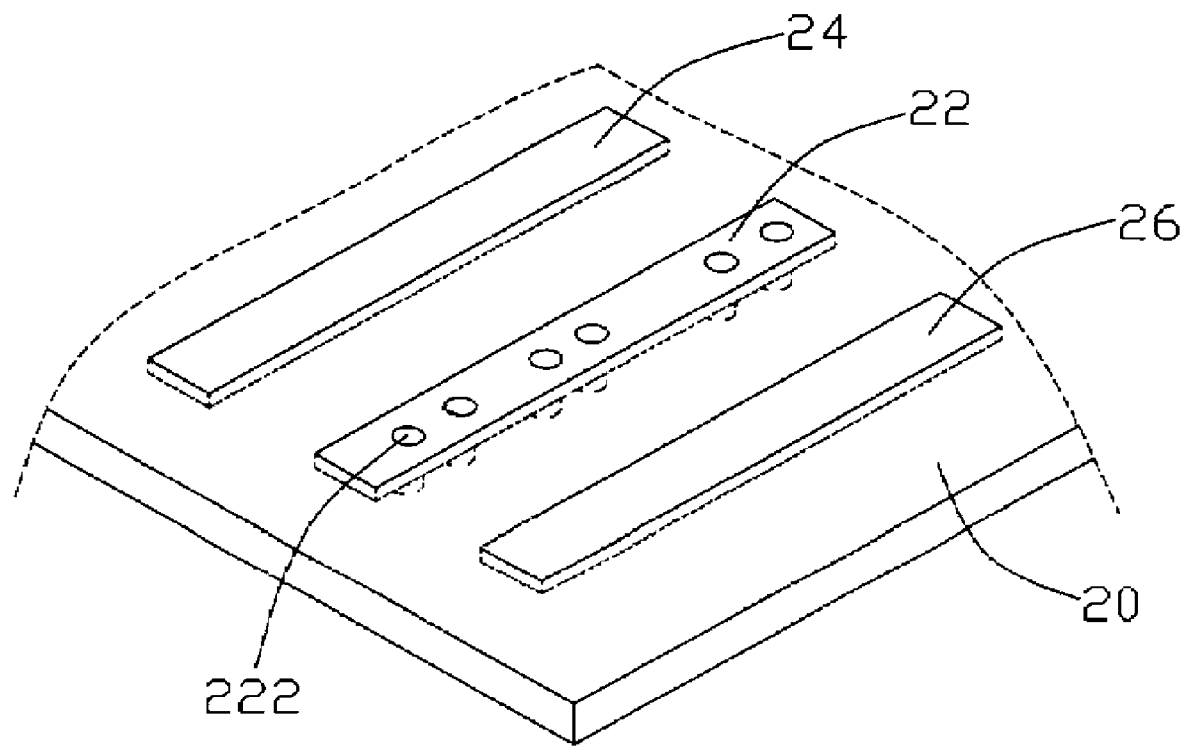
FIG. 1 is a schematic view of part of a signal layer of a conventional PCB.
Figure 2:
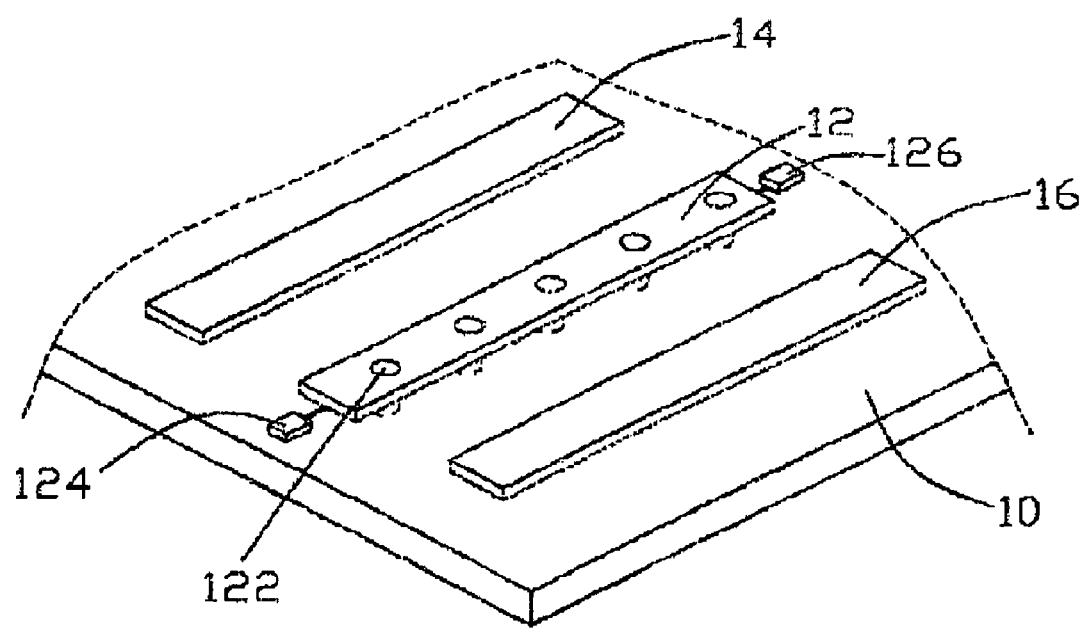
FIG. 2 is a schematic view of part of a signal layer of a PCB in accordance with a preferred embodiment of the present invention.

Referring to FIG. 2, in a preferred embodiment of the present invention, a printed circuit board (PCB) includes a signal layer 10 and a ground layer (not shown). The signal layer 10 includes a grounded line 12 and two signal lines 14, 16. The grounded line 12 is arranged between the two signal lines 14, 16 for reducing crosstalk of the signal lines 14 and 16. Suppose the signal line 14 is a driven line and a source of crosstalk disturbance, and the signal line 16 is undriven and therefore a victim line subject to the disturbance. During signals transmission, crosstalk occurs when there is a coupling of energy between the driven line 14 and the victim line 16. A plurality of vias 122 are defined in the grounded line 12, and the vias 122 are connected to the ground layer of the PCB.

To reduce crosstalk between the two signal lines 14 and 16 effectively, a method for designing the PCB needs to satisfy that a resonant frequency of an electromagnetic wave transmitted on the grounded line 12 is greater than a highest frequency of signals transmitted on the signal line 14. Firstly, to ensure correct distances between vias are used when manufacturing the PCB the following equations are used:

$$L = \lambda/2$$

so that $$F0 = C/(2L \times \sqrt{\xi})$$

where L is the distance between two adjacent vias 122, $\lambda$ is the resonant wavelength of the electromagnetic wave of the grounded line 12, F0 is a resonant frequency of the electromagnetic wave, C is a velocity of the electromagnetic wave in vacuum, and $\xi$ is a dielectric constant of the PCB.

For making the distance between each two adjacent vias 122 satisfy that the resonant frequency F0 of the electromagnetic wave is greater than a highest frequency Fb of signals of the signal line 14, the following relationship must be satisfied:

$$Fb < F0$$

then $$Fb < C/(2L \times \sqrt{\xi})$$

so that $$L < C/(2Fb \times \sqrt{\xi})$$

Secondly, designing the distance L between each two adjacent vias 122 according to the relationship (1). Thus, the grounded line 12 will reduce crosstalk between the signal lines 14 and 16 effectively.

As an example, when signals on the signal line 14 are high-speed signals, a rise time of the high-speed signal is T, thereby the highest frequency Fb of the high-speed signal is equal to 1/T. Thus, if the rise time T of the high-speed signal is knowable, then 1/T may be substituted for Fb of relationship (1) when designing the PCB.

As another example, when signals of the signal line 14 are radio-frequency signals, a highest carrier-frequency of the radio-frequency signal is Fc, a half of a bandwidth of the radio-frequency signal is Fh, thereby the highest frequency Fb of the radio-frequency signal is equal to a sum of the highest carrier-frequency Fc and a half of the bandwidth Fh. Thus, if the highest carrier-frequency Fc of the radio-frequency signal and a half of the bandwidth Fh of the radio-frequency signal are knowable, then Fc+Fh is substituted for Fb of relationship (1) when designing the PCB.

In this embodiment, two ends of the grounded line 12 are connected to two resistors 124 and 126 respectively, a resistance of each of the two resistors 124 and 126 is equal to a characteristic impedance of the grounded line 12. The two resistors 124 and 126 will further consume noise of die grounded line 12.

It is believed that the present embodiment and its advantages will be understood from the foregoing description, and it will be apparent that various changes may be made thereto without departing from the spirit and scope of the invention or sacrificing all of its material advantages, the example hereinbefore described merely being a preferred or exemplary embodiment.

What is claimed is:

1. A printed circuit board (PCB) comprising:
   at least one signal layer;
   a ground layer;
   at least two signal lines arranged on the at least one signal layer for transmitting signals; and
   at least one grounded line arranged on the at least one signal layer and between the at least two signal lines, a plurality of vias defined in the at least one grounded line, the vias connected to the ground layer, a distance between each two adjacent vias being so arranged that a resonant frequency of an electromagnetic wave transmitted on the at least one grounded line is greater than a highest frequency of the signals transmitted on the at least two signal lines;
   wherein distances of every two adjacent vias are equal, the distance of every two adjacent vias satisfies:

$L < C/(2Fb \times \sqrt{\xi})$ where L is the distance of each two adjacent vias, Fb is a highest frequency of signals of the at least two signal lines, C is a velocity of electromagnetic waves in a vacuum, and $\xi$ is a dielectric constant of the PCB.

2. The printed circuit board as claimed in claim 1, wherein each end of the at least one grounded line is connected to a resistor.

3. The printed circuit board as claimed in claim 2, wherein a resistance of each resistor is equal to a characteristic impedance of the grounded line.

4. A printed circuit board (PCB) comprising:
   at least one signal layer;
   a ground layer;
   at least two signal lines arranged on the at least one signal layer for transmitting signals; and at least one grounded line arranged on the at least one signal layer and between the at least two signal lines, a plurality of vias defined in the at least one grounded line, the vias connected to the ground layer, a distance between each two adjacent vias being so arranged that a resonant frequency of an electromagnetic wave transmitted on the at least one grounded line is greater than a highest frequency of the signals transmitted on the at least two signal lines;
   wherein distances of every two adjacent vias are equal, when signals of at least one of at the least two signal lines are high-speed signals, the distance of every two adjacent vias satisfies:

$L < (C \times T)/2\sqrt{\xi}$ where L is the distance of each two adjacent vias, T is a rise time of the high-speed signet C is a velocity of electromagnetic waves in a vacuum, and $\xi$ is a dielectric constant of the PCB.

5. The printed circuit board as claimed in claim 4, wherein each end of the at least one pounded line is connected to a resistor.

6. The printed circuit board as claimed in claim 5, wherein a resistance of each resistor is equal to a characteristic impedance of the grounded line.

7. A printed circuit board (PCB) comprising:
   at least one signal layer;
   a ground layer;
   at least two signal lines arranged on the at least one signal layer for transmitting signals; and at least one grounded line arranged on the at least one signal layer and between the at least two signal lines, a plurality of vias defined in the at least one grounded line, the vias connected to the ground layer, a distance between each two adjacent vias being so arranged that a resonant frequency of an electromagnetic wave transmitted on the at least one grounded line is greater than a highest frequency of the signals transmitted on the at least two signal lines;
   wherein distances of every two adjacent vias are equal, when signals of at least one of the at least two signal lines are radio-frequency signals, the distance of every two adjacent vias satisfies:

$L < C/[2\sqrt{\xi} \times (Fc+Fh)]$ where L is the distance of each two adjacent vias, Fc is a highest carrier-frequency of the radio-frequency signal, Fh is a half of a bandwidth of the radio-frequency signal, C is a velocity of electromagnetic waves in a vacuum, and $\xi$ is a dielectric constant of the PCB.

8. The printed circuit board as claimed in claim 7, wherein each end of the at least one grounded line is connected to a resistor.

9. The printed circuit board as claimed in claim 8, wherein a resistance of each resistor is equal to a characteristic impedance of the grounded line.

* * * * *